United States Patent
Chen et al.

[11] Patent Number: 5,966,632
[45] Date of Patent: Oct. 12, 1999

[54] METHOD OF FORMING BORDERLESS METAL TO CONTACT STRUCTURE

[75] Inventors: Min-Liang Chen; Rebecca Yicksin Tang, both of Hsinchu, Taiwan

[73] Assignee: Mosel Vitelic Inc., Hsinchu, Taiwan

[21] Appl. No.: 08/785,547

[22] Filed: Jan. 21, 1997

[51] Int. Cl.$^6$ .......................... H01L 21/44; H01L 21/302; H01L 21/461

[52] U.S. Cl. .......................... 438/652; 438/672; 438/674; 438/675; 438/692; 438/700

[58] Field of Search ..................... 438/700, 692, 438/652, 674, 672, 675

[56] References Cited

U.S. PATENT DOCUMENTS 5,691,238 11/1997 Avanzino et al. .
5,726,098 3/1998 Tsuboi .
5,801,099 9/1998 Kim et al. .

*Primary Examiner*—Richard Booth
*Assistant Examiner*—Josetta Jones

[57] ABSTRACT

The present invention is related to a method of fabricating borderless metal to contact structure. A dielectric layer is deposited on the silicon semiconductor wafer. The first photoresist pattern is formed by the conventional lithography technique. Then, the dielectric layer is partially etched to formed the first trench and second trench. The first trench is used as a contact hole, while the second trench is for second metal interconnection line. Thereafter, the second photoresist pattern which is only exposing the first trench region is formed. By using the second photoresist pattern as an etching mask, the dielectric layer is etched through to form the contact which is the place for the first metal line and second metal line to be electrically contacted. After the first and second photoresist patterns are stripped, the second metal layer is deposited to fill into the contact and the second trench as second metal interconnection lines. Finally, the second metal layer and a portion of the second dielectric layer are polished by chemical mechanical polishing (CMP) technique to planarize the wafer surface. A borderless metal to contact structure according to the present invention is achieved.

4 Claims, 4 Drawing Sheets

METHOD OF FORMING BORDERLESS METAL TO CONTACT STRUCTURE

BACKGROUND OF THE INVENTION (a) Field of the invention

The present invention relates generally to the field of fabrication of integrated circuits, and more particularly to the process of forming borderless metal to contact structure.

(b) Description of the Prior Art

In recent years, the sizes of the integrated circuits have become continuously smaller so that the packing densities of these IC devices have increased considerably. For example, a number of semiconductor manufacturing companies in the world have already begun mass production of 16M bit or even 64M bit DRAMs. In the conventional circuit design rule (see, for example, Niel Weste in "Principles of CMOS VLSI Design", p. 105, 1985), there must be a spacing for metal line 10 over contact 8 extension a each side to ensure lithography misalignment would not cause contact problem as shown in FIG. 1. Please referring now to FIG. 2, it shows a metal to contact structure according to the prior art FIG. 1. The metal 1 layer 4 is sputtered on a silicon substrate 2, and then an dielectric layer 6 covers the metal 1 layer 4. A contact 8 which is formed by the conventional lithography and plasma etching techniques is the place for metal 1 layer 4 and metal 2 layer 10 to be electrically contacted. As shown in FIG. 1, the pitch between two metal 2 lines must increase by 2a in order to satisfy the old design rule. Therefore, the packing density of the IC device becomes much smaller.

In today's sub-microm or even deep sub-microm VLSI technology, how to reduce the pitch between metal lines becomes a top priority.

SUMMARY OF THE INVENTION

The prime object of the present invention is to provide a method of fabricating borderless metal to contact structure.

Another object of the present invention is to provide a method of fabricating integrated circuits which have higher packing density.

These objects are accomplished by the fabrication process described below.

First, a Metal-Oxide-Semiconductor Field Effect Transistor (MOSFET) which comprises gate oxide, gate electrode and source/drain regions are formed on a silicon semiconductor wafer.

Next, the first dielectric layer is deposited on the silicon semiconductor wafer. The contact holes are then formed by lithography and plasma-etching techniques. The metal interconnection line which is electrically connected to the source/drain regions of the MOSFET through contact holes is formed overlaying the first dielectric layer.

Next, the second dielectric layer is deposited overlaying the first metal interconnection line. A first photoresist pattern which is the reversed tone of the second metal interconnection is formed by the conventional lithography technique. Then, the second dielectric layer is partially etched to formed the first trench and second trench. The first trench is used as a contact hole, while the second trench is for second metal interconnection line. Thereafter, the second photoresist pattern which is only exposing the first trench region is formed. By using the second photoresist pattern as an etching mask, the second dielectric layer is etched through to form the contact which is the place for the first metal line and second metal line to be electrically contacted. After the first and second photoresist patterns are stripped, the second metal layer is deposited to fill into the contact and the second trench as second metal interconnection lines. Finally, the second metal layer and a portion of the second dielectric layer are polished by chemical mechanical polishing (CMP) technique to planarize the wafer surface. A borderless metal to contact (or so called self-aligned contact) structure according to the present invention is achieved.

BRIEF DESCRIPTION OF THE DRAWINGS

The accompanying drawings forming a material part of this description, in which.

DESCRIPTION OF THE PREFERRED EMBODIMENT

The invention discloses herein is directed to a method of fabricating the borderless metal to contact structure of integrated circuits. In the following description, it illustrates the metal 1 and metal 2 contact structure as one preferred embodiment. It will be obvious, however, to one skilled in the art of integrated circuits that these specific details need not be employed to practice the present invention, for example, any two conducting layer contact structure such as metal 1 to source/drain of the MOSFET or metal 1 to gate electrode. In other instance, well-know processing steps are not described in detail in order not unnecessarily to obscure the present invention.

Figure 1:
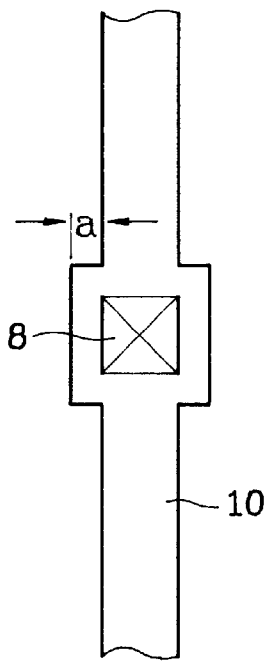
FIG. 1 is the conventional metal contact layout which has a contact extension.
Figure 2:
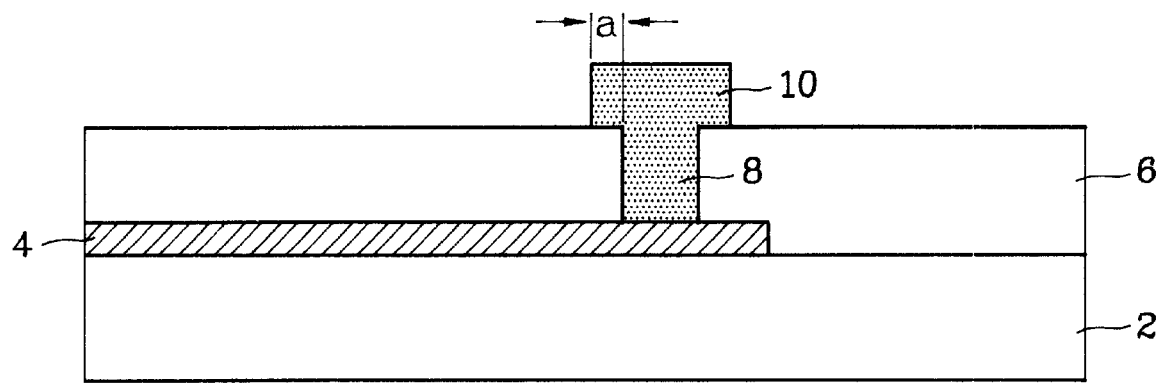
FIG. 2 is the cross sectional view of a silicon wafer corresponding to FIG. 1.
Figure 3:
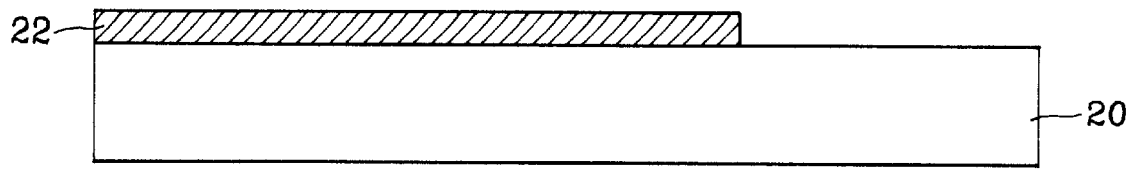
FIGS. 3 through 10 schematically illustrate in cross sectional representation one preferred embodiment of the present invention.

Referring now more particularly to FIG. 3, there is shown a portion of a partially completed integrated circuit. The semiconductor silicon wafer which is preferably composed of monocrystalline (100) silicon is used as a substrate. Field oxide regions (not shown in the Figures) have been formed in the semiconductor silicon wafer for isolation. The thickness of the field oxide layer is about 3500 to 6500 Angstroms MOSFET regions (also not shown in the Figures) which comprise a gate oxide, gate, source and drain electrodes have been formed as conventional process in the art.

Referring now to FIG. 3 again, the first dielectric layer 20 and the first metal layer are continuously deposited on the silicon wafer (not shown in the figures). The first dielectric layer 20 is typically a layer of boron phosphosilicate glass (BPSG) or phosphosilicate glass (PSG) formed by atmosphere chemical vapor deposition (APCVD) technique to have a thickness of about 3000 to 10000 Angstroms. After the first dielectric layer 20 deposition, it usually performs the thermal reflow or CMP to plagiarize the silicon wafer surface. The first conducting layer 22 which can be low resistivity metals such as aluminum or tungsten or even low resistivity polysilicon, has a thickness of 4000 to 8000 Angstroms.

Figure 4:
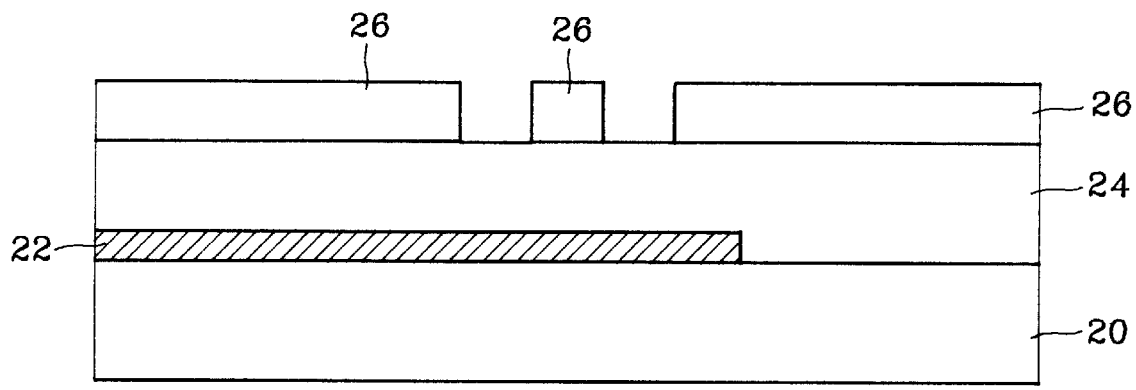

Referring now to FIG. 4, the second dielectric layer 24 is formed overlaying the first conducting layer 22. Then, the first photoresist pattern 26 which is the reversed-tone pattern of the second conducting interconnection line is formed by the conventional lithography technique as shown in FIG. 4. The second dielectric layer 24 is preferably a layer of oxide ($SiO_2$) formed by plasma enhanced chemical vapor deposition (PECVD) at a temperature between 300 to 400° C. to a thickness of about 3500 to 8000 Angstroms. Thereafter, the second dielectric layer 24 is also planarized by the method described above.

Figure 5:
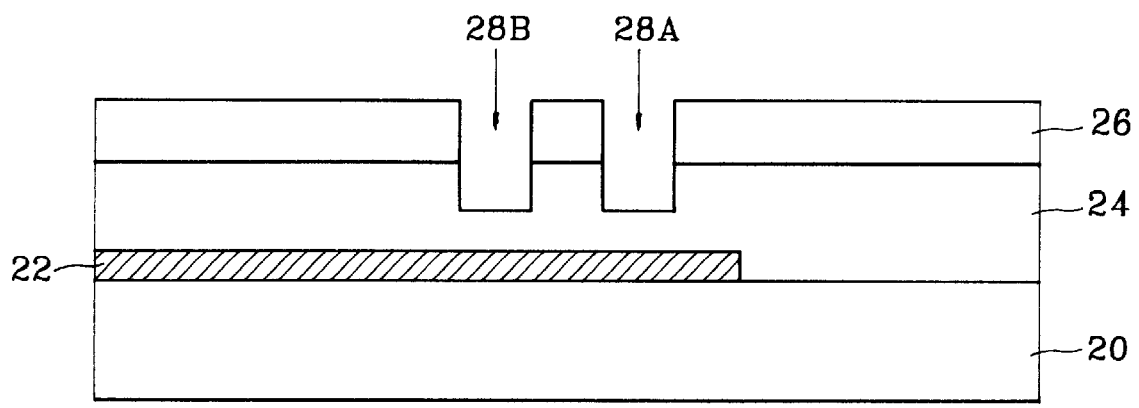

Referring now to FIG. 5, the second dielectric layer 24 is partially etched by plasma-etching technique to form the first trench 28A and the second trench 28B. The first trench 28A is used as a contact hole where the first conducting layer and second conducting line are electrically connected, while the second trench 28B is for the deposition of the second conducting line. The plasma-etching process can use magnetic enhanced reactive ion etching (MERIE), electron cyclotron etching (ECR), or the conventional reactive ion etching (ECR) methods. In today's sub-microm VLSI technology, the second dielectric layer 24 may be etched by a MERIE plasma etcher such as a Lam Research Inc. Model Rainbow 4520 with reactant gases of $CF_4$, $CHF_3$, and Ar.

Figure 6:
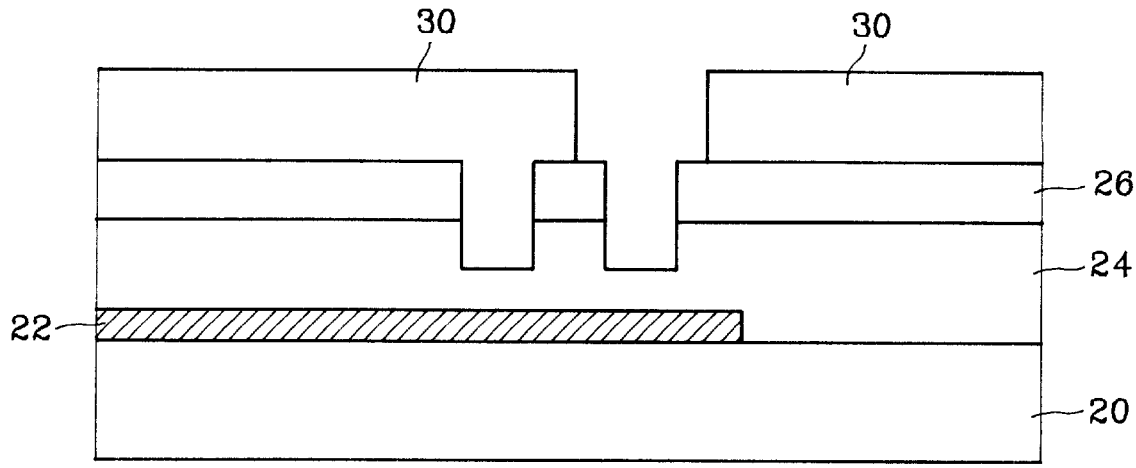

Referring now to FIG. 6, after baking the first photoresist layer, the second photoresist layer 30 is coated and patterned by the conventional lithography technique to form the second photoresist pattern 30A as shown in FIG. 6. The second photoresist pattern 30A only exposes the first trench region 28A.

Figure 7:
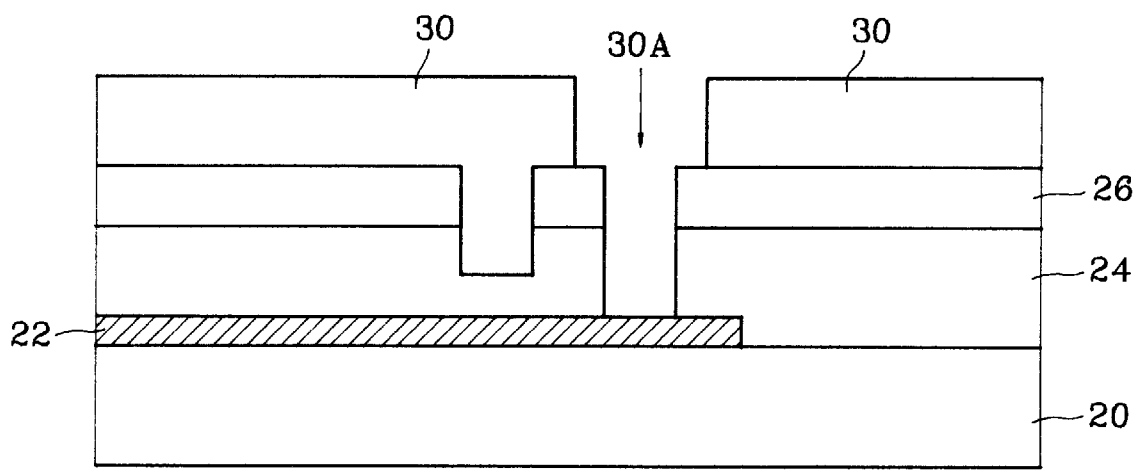

Referring now to FIG. 7, by using the first 26 and second photoresist layer 30 as an etching mask, the remaining second dielectric layer in first trench is etched through the first metal layer 22 to form the contact hole 30A by plasma-etching technique. The second dielectric layer 24 plasma-etching process can also use MERIE method with reactant gases such as $CF_4$, $CHF_3$, and Ar.

Figure 8:
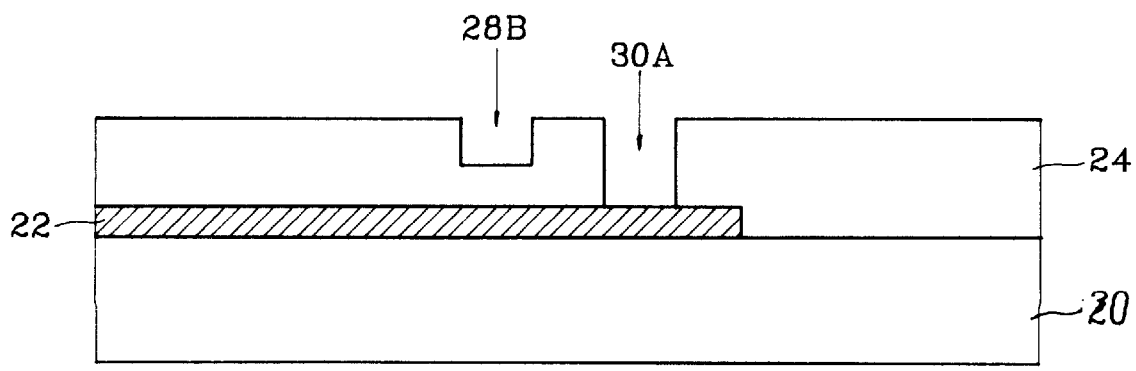

Referring now to FIG. 8, the first 26 and second 30 photoresist layers are stripped by oxygen plasma and sulfuric acid to uncover the second dielectric layer 24 as shown in FIG. 8.

Figure 9:
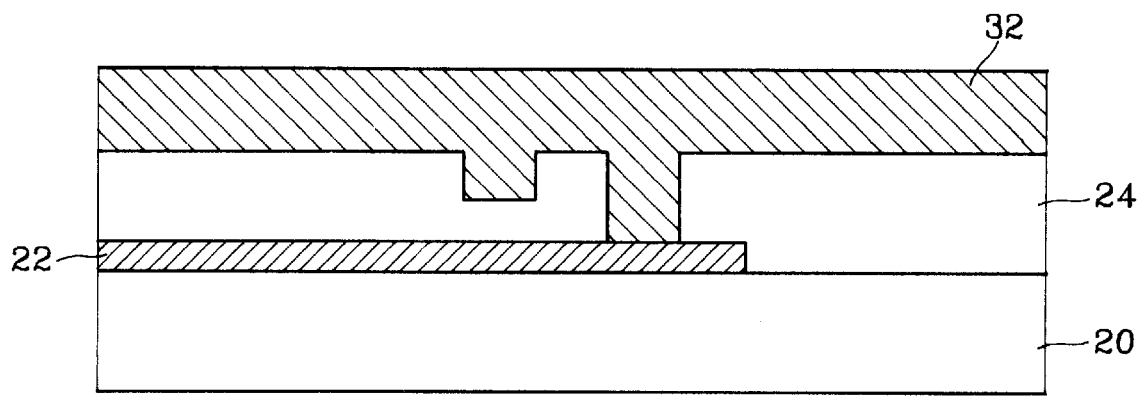

Referring now to FIG. 9, the second conducting layer 32 is deposited to fill into the contact hole 30A and the second trench 28B. The second conducting layer 32 is also made of low resistivity metals as described before.

Figure 10:
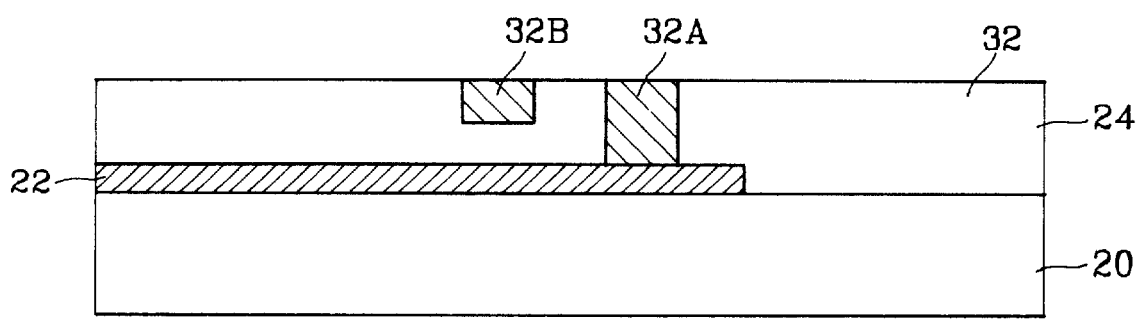

Referring now to FIG. 10, the second conducting layer 32 and the portion of second dielectric layer 24 are planarized by chemical mechanical polishing (CMP) technique. The borderless metal to (self-aligned) contact structures are formed. Therefore, there is no need to have metal contact extension overlap as the prior art would. The pitch between two conducting lines is reduced by the length of 2a, that tremendously increases the packing density of the IC devices.

While the invention has been particularly shown and described with reference to a preferred embodiment, it will be understood by those skilled in the art that various changes in form and detail may be made therein without departing from the spirit and scope of the present invention.

What we claimed is:

1. A method of fabricating the borderless metal to contact structure of integrated circuits, comprising the steps of:

(a) forming the MOSFET structure on a semiconductor silicon wafer, wherein said MOSFET comprises gate oxide, gate electrode, source/drain electrodes;

(b) forming the first dielectric layer on said semiconductor silicon wafer;

(c) forming the first conducting layer overlaying said first dielectric layer;

(d) forming the second dielectric layer overlaying said first conducting layer;

(e) forming the first photoresist pattern overlaying said second dielectric layer by the conventional lithography technique;

(f) partially etching said second dielectric layer to form the first trench and the second trench;

(g) forming the second photoresist pattern, wherein said second photoresist pattern only exposing said first trench region;

(h) etching the remaining of said second dielectric layer therein said first trench to form the contact hole;

(i) stripping said first photoresist pattern and said second photoresist pattern;

(j) depositing the second conducting layer to fill into said contact hole and said second trench;

(k) polishing a portion of said second dielectric layer and said second conducting layer to form the second conducting plug therein said contact hole and said second trench.

2. The method of claim 1, wherein said first dielectric layer comprises at least one layer of dielectric.

3. The method of claim 1, wherein said second dielectric layer comprises at least one layer of dielectric.

4. The method of claim 1, wherein said polishing is by the chemical mechanical polishing (CMP) technique.

* * * * *